(12) United States Patent
Kim et al.

(10) Patent No.: US 8,558,246 B2
(45) Date of Patent: Oct. 15, 2013

(54) LIGHT EMITTING DIODE, METHOD FOR FABRICATING PHOSPHOR LAYER, AND LIGHTING APPARATUS

(75) Inventors: Jin Ha Kim, Seoul (KR); Kyu Sang Kim, Seoul (KR); Jae Yoo Jeong, Gyunggi-do (KR); Chung Bae Jeon, Gyunggi-do (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 139 days.

(21) Appl. No.: 12/964,326

(22) Filed: Dec. 9, 2010

(65) Prior Publication Data

US 2011/0133220 A1 Jun. 9, 2011

(30) Foreign Application Priority Data

Dec. 9, 2009 (KR) .................. 10-2009-0121826
Nov. 16, 2010 (KR) .................. 10-2010-0114132

(51) Int. Cl.
 *H01L 27/15* (2006.01)
 *H01L 29/267* (2006.01)
 *H01L 31/12* (2006.01)
 *H01L 33/00* (2010.01)

(52) U.S. Cl.
 USPC ......... 257/81; 257/E33.032; 438/29; 313/503

(58) Field of Classification Search
 USPC ......... 257/13, 14, 21, 79, 80, 81, 88, 98, 678, 257/737, E33.001–E33.017, 257/E33.056–E33.068, E23.02, 257/E23.024–E23.025; 438/26, 29, 118
 See application file for complete search history.

(56) References Cited

U.S. PATENT DOCUMENTS

| | | | |
|---|---|---|---|
| 8,076,690 B2 * | 12/2011 | Ueno et al. .............. 257/98 |
| 2005/0077531 A1 | 4/2005 | Kim | |
| 2006/0097621 A1 | 5/2006 | Park et al. | |
| 2009/0014731 A1 | 1/2009 | Andrews et al. | |

FOREIGN PATENT DOCUMENTS

| | | |
|---|---|---|
| CN | 1547265 A | 11/2004 |
| CN | 101061589 A | 10/2007 |
| JP | 2008-103599 A | 5/2008 |
| JP | 2009-076749 | 4/2009 |
| KR | 10-2005-0034936 A | 4/2005 |
| KR | 10-2006-0071958 A | 6/2006 |
| WO | WO-2006/055456 A1 | 5/2006 |

OTHER PUBLICATIONS

Machine translation of JP 2009-76749.*
Chinese Office Action, and English translation thereof, issued in Chinese Patent Application No. 201010592259.1 mailed Sep. 27, 2012.
Chinese Office Action, w/ English translation thereof, issued in Chinese Patent Application No. CN 201010592259.1 dated Apr. 1, 2013.

* cited by examiner

*Primary Examiner* — Julio J Maldonado
*Assistant Examiner* — Sonya D McCall Shepard
(74) *Attorney, Agent, or Firm* — McDermott, Will & Emery LLP

(57) ABSTRACT

A light emitting diode includes: a light emitting diode chip including a substrate and a light emission structure disposed on the substrate; and a phosphor layer formed to cover at least one surface of a diode upper surface and a diode lower surface, when a surface formed by the light emitting diode chip, when viewed from above the light emission structure, is defined as the diode upper surface and a surface formed by the light emitting diode chip, when viewed from below the substrate is defined as the diode lower surface. The phosphor layer is formed in a manner such that the phosphor layer does not deviate from the diode upper surface or the diode lower surface and has a flat surface parallel to the diode upper surface or the diode lower surface and a curved surface connecting the flat surface to corners of the diode upper surface or the diode lower surface.

23 Claims, 8 Drawing Sheets

LIGHT EMITTING DIODE, METHOD FOR FABRICATING PHOSPHOR LAYER, AND LIGHTING APPARATUS

CROSS-REFERENCE TO RELATED APPLICATIONS

This application claims the priority of Korean Patent Application Nos. 2009-0121826 filed on Dec. 9, 2009 and 2010-0114132 filed on Nov. 16, 2010, in the Korean Intellectual Property Office, the disclosures of which are incorporated herein by reference.

BACKGROUND OF THE INVENTION

1. Field of the Invention

The present invention relates to a light emitting diode, a method for fabricating a phosphor layer, and a lighting apparatus, and more particularly, to a light emitting diode which includes a light emitting diode chip having a surface coated with a phosphor layer to emit white light.

2. Description of the Related Art

Recently, a light emitting diode using a nitride-based semiconductor has been utilized as a white light source in a variety of fields for applications in devices such as a key pad, a backlight, a traffic light, a guide light of an airstrip, and an illumination light. As the utilization of light emitting diode chips has diversified, much attention has been paid to the technology for packaging the light emitting diode chips.

FIG. 1 is a schematic cross-sectional view of a light emitting diode package according to the related art. Referring to FIG. 1, the light emitting diode package 10 according to the related art includes first and second lead frames 13 and 14 disposed in a package body 12 and a light emitting diode 11 mounted on the first lead frame 13. The light emitting diode 11 is electrically connected to the first and second lead frames 13 and 14 by a wire W. The package body 12 has a cup shape, and the cup-shaped internal space thereof is filled with resin 15 to protect the light emitting diode 11, the wire W and so on. In this case, phosphor materials capable of converting the wavelength of light emitted from the light emitting diode 11 may be dispersed in the resin 15, in order to emit white light.

In the case of the light emitting diode 10 according to the related art, light is emitted from the surface of the resin 15 exposed to the outside. Therefore, the etendue of the light source increases. Here, the term etendue refers to a value obtained by multiplying the area of a light source by the solid angle of emitted light. When the area of the light source increases, the etendue thereof increases. Since the light emitting diode package 10, according to the related art, has a structure in which light is emitted through the resin having phosphors dispersed therein, the etendue is so high that it is difficult to apply the light emitting diode package 10 to an application requiring a low etendue. Furthermore, when the light emitting diode package according to the related art is used, the color temperature difference between the area in which the light emitting diode 11 is positioned and the peripheral area thereof is large. Therefore, when the radiation pattern of light emitted through a lens is seen from above, a color spot known as a bull's eye may occur.

SUMMARY OF THE INVENTION

An aspect of the present invention provides a light emitting diode capable of improving light emission efficiency and reducing a color temperature difference between products in terms of white light emission.

Another aspect of the present invention provides a method for fabricating a phosphor layer, which is capable of providing an efficient and easy application process.

Another aspect of the present invention provides a lighting apparatus using the light emitting diode.

According to an aspect of the present invention, there is provided a light emitting diode including: a light emitting diode chip including a substrate and a light emission structure disposed on the substrate; and a phosphor layer formed to cover at least one surface of a diode upper surface and a diode lower surface, when a surface formed by the light emitting diode chip when viewed from above the light emission structure, is defined as the diode upper surface and a surface formed by the light emitting diode chip, when viewed from below the substrate, is defined as the diode lower surface. The phosphor layer is formed in a manner such a that the phosphor layer does not deviate from the diode upper surface or the diode lower surface and has a flat surface parallel to the diode upper surface or the diode lower surface and a curved surface connecting the flat surface to corners of the diode upper surface or the diode lower surface.

The light emitting diode chip may further include a bonding pad formed on a part of the diode upper surface.

The phosphor layer may be formed so as to cover the bonding pad.

The light emitting diode may further include a conductive wire connected to the bonding pad.

The conductive wire may include a bonding portion provided in a region which is in contact with the bonding pad, the bonding portion having a wider width than that of the other portion of the conductive wire. The phosphor layer may be formed so as to cover at least a part of the bonding portion.

The light emission structure may include n-type and p-type semiconductor layers and an active layer formed between the n-type and p-type semiconductor layers.

The substrate may include a conductive substrate, and the light emission structure is formed in such a manner that the p-type semiconductor layer, the active layer, and the n-type semiconductor layer are sequentially disposed on the basis of the substrate.

The upper surface of the light emission structure may include two or more surfaces which are disposed to have a level difference therebetween.

The phosphor layer may be formed so as to cover at least a part of side surfaces of the light emission structure and so as not to cover side surfaces of the substrate.

The phosphor layer may include transparent resin and phosphors.

The phosphor layer may contain the phosphors at a ratio in which the amount of the phosphors is two or more times larger than the amount of the transparent resin, based on a weight ratio of the phosphors to the transparent resin.

The phosphor layer may further include transparent fine particles. The transparent fine particles may include one or more materials selected from the group consisting of $SiO_2$, $TiO_2$, and $Al_2O_3$.

The phosphor layer may contain the transparent fine particles at a ratio in which the amount of the phosphors is two or more times larger than the amount of the transparent fine particles, based on a weight ratio of the phosphors to the transparent fine particles.

According to another aspect of the present invention, there is provided a method for fabricating a phosphor layer, including: preparing a light emitting diode chip including a substrate and a light emission structure disposed on the substrate; and forming a phosphor layer covering a diode upper surface or diode lower surface by applying a mixture including transparent resin, phosphors, and a solvent onto at least one of the diode upper surface and the diode lower surface, when a surface formed by the light emitting diode chip, when viewed from above the light emission structure, is defined as the diode upper surface and a surface formed by the light emitting diode chip, when viewed from below the substrate, is defined as the diode lower surface. In the forming of the phosphor layer, the solvent is evaporated from the mixture applied to the diode upper surface or the diode lower surface such that fluidity of the mixture decreases.

The forming of the phosphor layer may include heating the mixture applied to the diode upper surface or the diode lower surface.

The forming of the phosphor layer may include performing a dispensing process while moving a dispenser containing the mixture in a spiral or zigzag form.

The forming of the phosphor layer may include continuously applying the mixture such that a state in which the mixture is connected from the diode upper surface or the diode lower surface to the dispenser is maintained.

The method may further include forming a bonding pad on a part of the diode upper surface, before the forming of the phosphor layer.

The method may further include connecting a conductive wire to the bonding pad, before the forming of the phosphor layer.

The phosphor layer may be formed so as to cover the bonding pad.

The phosphor layer may be formed so as to cover at least a part of side surfaces of the light emission structure.

The phosphor layer may contain the phosphors at a ratio in which the amount of the phosphors is two or more times larger than the amount of the transparent resin, based on a weight ratio of the phosphors to the transparent resin.

The solvent may include a volatile material.

The mixture may further include transparent fine particles.

The transparent fine particles may include one or more materials selected from the group consisting of $SiO_2$, $TiO_2$, and $Al_2O_3$.

The phosphor layer may contain the phosphors at a ratio in which the amount of the phosphors is two or more times larger than the amount of the transparent fine particles, based on a weight ratio of the phosphors to the transparent fine particles.

According to another aspect of the present invention, there is provided a lighting apparatus including: first and second terminals; and one or more light emitting diodes, each including: a light emitting diode chip including a substrate and a light emission structure disposed on the substrate; and a phosphor layer formed to cover at least one surface of a diode upper surface and a diode lower surface, when a surface formed by the light emitting diode chip, when viewed from above the light emission structure, is defined as the diode upper surface and a surface formed by the light emitting diode chip, when viewed from below the substrate, is defined as the diode lower surface. The phosphor layer is formed in a manner such that the phosphor layer does not deviate from the diode upper surface or the diode lower surface and has a flat surface parallel to the diode upper surface or the diode lower surface and a curved surface connecting the flat surface to corners of the diode upper surface or the diode lower surface.

The phosphor layer may include at least one of a phosphor and a quantum dot, and may not be in contact with the first and second terminals.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
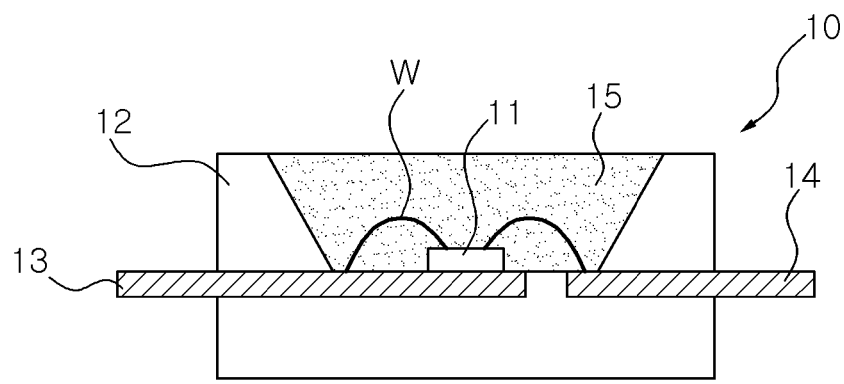
FIG. 1 is a schematic cross-sectional view of a light emitting diode package according to the related art.

Exemplary embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like reference numerals in the drawings denote like elements, and thus their description will be omitted.

Figure 2:
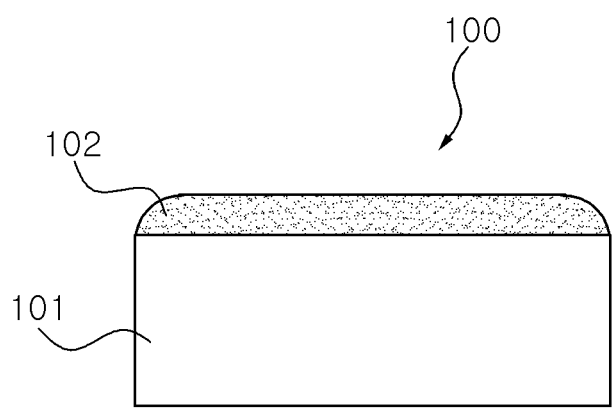
FIG. 2 is a schematic cross-sectional view of a light emitting diode according to an embodiment of the present invention.

FIG. 2 is a schematic cross-sectional view of a light emitting diode according to an embodiment of the present invention. Referring to FIG. 2, the light emitting diode 100 according to the embodiment of the present invention includes a light emitting diode chip 101 and a wavelength conversion portion 102 formed on a diode upper surface. The diode upper surface indicates a surface formed by the light emitting diode chip 101, when the light emitting diode chip 101 is viewed from above, more specifically, when viewed from above a light emission structure provided in the light emitting diode 101, the diode upper surface may be defined as a surface formed by the light emitting diode chip 101. The light emission structure includes first and second conductive-type semiconductor layers and an active layer, and is represented by S in FIG. 4. This will be described below in detail. From the aspect that the diode upper surface is a surface formed when viewed from above, the diode upper surface may include a surface formed by regions having different heights or containing different formation materials. For example, referring to FIG. 4, one upper surface may be formed by the light emission structure S, a p-type contact layer 208, and a p-electrode 203. Terms such as 'upper surface', 'lower surface', and 'side surface' used in this specification are based on the drawings. In actuality, the terms may be changed depending on the direction in which the light emitting diode is disposed.

The wavelength conversion portion 102 performs a function of converting the wavelength of light emitted from the light diode chip 101. For this function, the wavelength conversion portion 102 may have a structure in which phosphors are dispersed in transparent resin. When the light of which the wavelength is converted by the wavelength conversion portion 102 and the light emitted from the light emitting diode 101 are mixed, the light emitting diode 100 may emit white light. For example, when the light emitting diode chip 101 emits blue light, yellow phosphors may be used. When the light emitting diode chip 101 emits ultraviolet light, red, green, and blue phosphors may be mixed and used. In addition, the colors of the light emitting diode chip 101 and the phosphors maybe combined in various manners, in order to realize the emission of white light. Furthermore, without being limited to the white color, only wavelength conversion materials such as green or red phosphors may be applied to implement a light source emitting the corresponding color.

Specifically, when the light emitting diode 101 emits blue light, a nitride-based phosphor having a compositional formula of $MAlSiN_x:Re$ ($1 \leq x \leq 5$) and a sulfide-based phosphor having a compositional formula of MD:Re may be used as the red phosphor. Here, M may include at least one selected from Ba, Sr, Ca, and Mg, D may include at least one selected from S, Se, and Te, and Re may include at least one selected from Eu, Y, La, Ce, Nd, Pm, Sm, Gd, Tb, Dy, Ho, Er, Tm, Yb, Lu, F, Cl, Br, and I. Furthermore, the green phosphor may include a silicate-based phosphor having a compositional formula of $M_2SiO_4:Re$, a sulfide-based phosphor having a compositional formula of $MA_2D_4:Re$, a phosphor having a compositional formula of $\beta$-SiAlON:Re, and an oxide-based phosphor having a compositional formula of $MA'_2O_4:Re'$. Here, M may include at least one element selected from Ba, Sr, Ca, and Mg, A may include at least one selected from Ga, Al, and In, D may include at least one selected from S, Se, and Te, A' may include at least one selected from Sc, Y, Gd, La, Lu, Al, and In, Re may include at least one selected from Eu, Y, La, Ce, Nd, Pm, Sm, Gd, Tb, Dy, Ho, Er, Tm, Yb, Lu, F, Cl, Br, and I, and Re' may include at least one selected from Ce, Nd, Pm, Sm, Tb, Dy, Ho, Er, Tm, Yb, F, Cl, Br, and I.

Meanwhile, quantum dots may be provided in the wavelength conversion portion 102 in place of, or together with, the phosphors. A quantum dot is a nano-crystal particle including a core and a shell, and the size of the core ranges from 2 to 100 nm. By adjusting the size of the core, the quantum dot may be used as a phosphor material emitting various colors of light such as blue (B), yellow (Y), green (G), and red (R). The core and shell structure forming the quantum dot may be formed by hetero-joining at least two kinds of semiconductors selected from a group II-VI compound semiconductor, a group III-V compound semiconductor, and a group IV semiconductor. The group II-VI compound semiconductor may include ZnS, ZnSe, ZnTe, CdS, CdSe, CdTe, HgS, HgSe, HgTe, MgTe and so on. The group III-V compound semiconductor may include GaN, GaP, GaAs, GaSb, InN, InP, InAs, InSb, AlAs, AlP, AlSb, AlS and so on. The group IV semiconductor may include Ge, Si, Pb and so on. In this case, an organic ligand using a material such as oleic acid may be formed outside the shell of the quantum dot, in order to terminate molecular binding on the shell surface or suppress the condensation of the quantum dot. Furthermore, when the organic ligand is formed outside the shell of the quantum dot, the dispersibility in resin such as silicon resin or epoxy resin and the phosphor function may be improved. Such a quantum dot exhibits vulnerability to moisture or air. In particular, when the quantum dot comes into contact with plating patterns of a substrate (refer to FIG. 9) or lead frames of a package (refer to FIGS. 10 and 11), a chemical reaction may occur. As will be described below, the wavelength conversion portion 102 may be applied only to the diode upper surface or diode lower surface of the light emitting diode chip 101 such that the quantum dot is not in contact with the plating patterns or the lead frames, thereby improving the reliability of the diode. Therefore, even when a phosphor is used as the wavelength conversion material, the phosphor may be substituted with a quantum dot or the quantum dot may be added to the phosphor.

In this embodiment, the wavelength conversion portion 102 is applied in a thin-film form onto the diode upper surface of the light emitting diode chip 101. Compared with the related art in which phosphors or the like are injected into the cup of the package body, it is possible to obtain uniform light dispersion. Furthermore, it is possible to reduce the size of the diode, in that the wavelength conversion portion 102 may be directly applied to the surface of the light emitting diode chip 101 and the package body may be not separately provided. When viewed from above the light emitting diode chip 101, the wavelength conversion portion 102 is formed in a manner such that the wavelength conversion portion 102 does not deviate from the diode upper surface. Referring to FIG. 2, a region adjacent to the corner of the diode upper surface is formed with a curved surface. In this case, the other region excluding the region formed with a curved surface, that is, a region adjacent to the center of the diode upper surface is formed with a flat surface which is almost parallel to the diode upper surface. Therefore, the wavelength conversion portion 102 has a structure in which the flat surface is connected to the corner of the diode upper surface through the curved surface. Here, the flat surface may not only mean that the height of the entire upper surface is constant, but also mean that a height deviation occurs inevitably, due to the process's characteristic. For example, the height of the flat surface may be varied in the range of about −10 to +10%, based on the mean value thereof. Furthermore, when the region adjacent to the center, in which the flat surface is formed, is roughly defined, the region may include a region corresponding to about 70% from the center of the diode upper surface toward the corner. In this case, a continuous dispensing process, which will be described below, may be performed in such a manner that the wavelength conversion portion 102 has a thickness of about 25 to 150 μm.

In this embodiment, as the wavelength conversion portion 102 is limitedly formed only on the diode upper surface, the substantial area of the light source may become almost equal to the area of the diode upper surface. Accordingly, the light intensity per area of the light source increases. As the light intensity per area of the light source increases, the light emitting diode 100 according to the embodiment of the present invention may be properly used in a lighting apparatus which requires a light source having a low etendue, for example, a camera flash unit, a head lamp for vehicle, a projector light source or the like. Meanwhile, as described above, the wavelength conversion portion 102 has a structure in which the resin and the phosphors are mixed. In particular, based on the weight ratio of the phosphors to the resin, the weight of the phosphors contained in the wavelength conversion portion 102 is two or more times larger than that of the resin. The weight ratio corresponds to a ratio in which the amount of phosphors is much larger than that of resin, compared with a general mixing ratio of resin to phosphors, which ranges from 10:1 to 1:1. Such a shape of the wavelength conversion portion 102 and the resin/phosphor mixing ratio are unique characteristics obtained by a phosphor layer formation process which will be described below. Furthermore, the wavelength conversion portion 102 may further include transparent fine particles. The transparent fine particles are mixed with the phosphors and the resin, and may include materials such as $SiO_2$, $TiO_2$, and $Al_2O_3$. As the ratio of the transparent fine particles included in the wavelength conversion portion 102 and to the phosphors is properly adjusted, the color temperature of light emitted to the outside may be set to a desired level. For example, based on the weight ratio of the phosphors and the transparent fine particles, the amount of the phosphors mixed in the wavelength conversion portion 102 is two or more times larger than that of the transparent fine particles.

Figure 3:
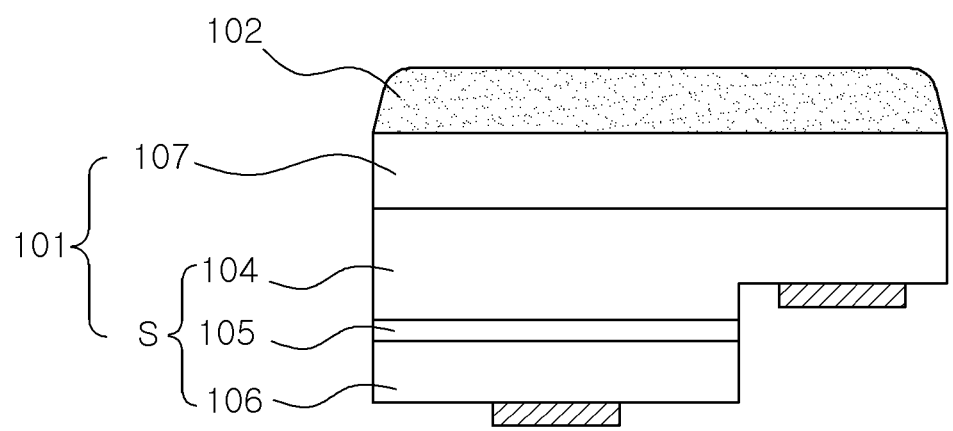
FIGS. 3 and 4 are schematic cross-sectional views illustrating an example of a light emitting diode chip which may be adopted in the light emitting diode of FIG. 2.
Figure 4:
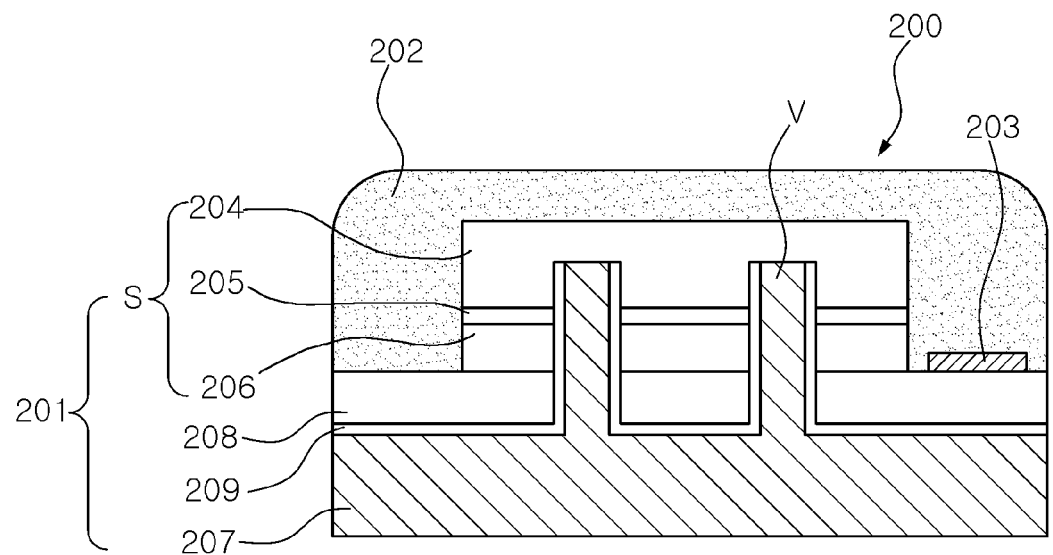

Meanwhile, the light emitting diode chip 101 is a kind of semiconductor light emitting diode which emits light by using power applied from outside, and may employ a variety of structures, if necessary. Examples of the structures will be described with reference to FIGS. 3 and 4. FIGS. 3 and 4 are schematic cross-sectional views illustrating an example of a light emitting diode chip which may be adopted in the light emitting diode of FIG. 2. Specifically, the light emitting diode chip of FIG. 3 has a structure in which a bonding pad is not formed on a diode uppers surface, while the light emitting diode chip of FIG. 4 has a structure in which a bonding pad is formed on a portion forming the diode upper surface.

Referring to FIG. 3, the light emitting diode chip 101 includes a substrate 107, an n-type semiconductor layer 104, an active layer 105, and a p-type semiconductor layer 106. The n-type semiconductor layer 104 has an n-electrode 103a formed on an exposed surface thereof, and the p-type semiconductor layer 106 has a p-electrode 103b formed on the surface thereof. The n-type and p-type semiconductor layers 104 and 106 and the active layer 105 formed between the n-type and p-type semiconductor layers 104 and 106 form the light emission structure S. The substrate 107 may be provided as a substrate for growing semiconductor single crystals, which is formed of sapphire or the like. The wavelength conversion portion 102 is formed on a surface facing the surface on which the light emission structure S is formed. Referring to FIG. 3, the wavelength conversion portion 102 is formed on the diode upper surface. In a more general structure, however, FIG. 3 may be turned upside down to position the light emission structure S at the upper portion thereof. In this case, it may be considered that the wavelength conversion portion 102 is formed on the diode lower surface which is formed when viewed from below the substrate 107.

Figure 9:
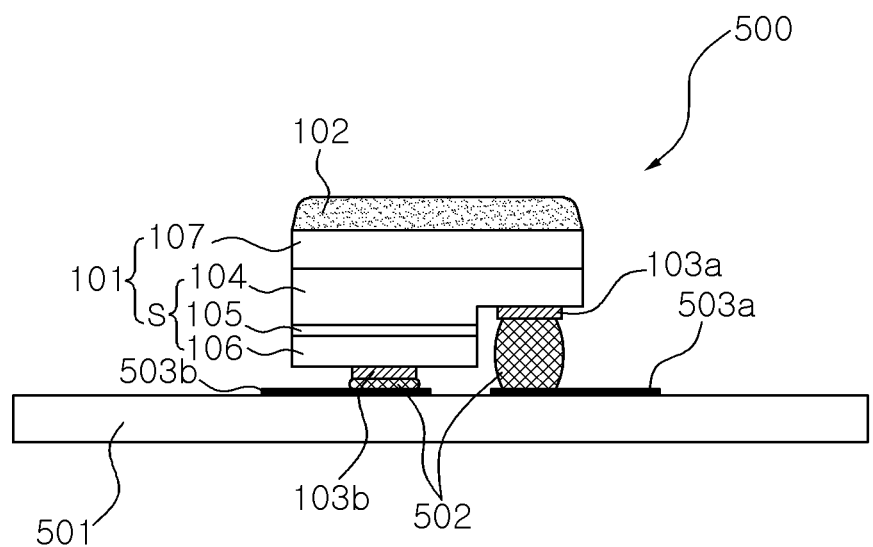
FIGS. 9 and 10 are schematic cross-sectional views of a light emitting apparatus using the light emitting diode proposed in the embodiment of the present invention.

As described above, the upper surface of the wavelength conversion portion 102 has a structure in which a flat surface is formed in the region adjacent to the center thereof and a curved surface is formed in region adjacent to the corner thereof. Referring to FIG. 9, the light emitting diode of FIG. 3 may be flip-chip bonded to conductive patterns 503a and 503b of a printed circuit board (PCB) 501 or the like and used as a lighting emitting apparatus 500. During the flip-chip bonding, conductive bumps 502 may be used to bond the n-electrode 103a and p-electrode 103b to the conductive patterns 503a and 503b. Although not illustrated, a ceramic substrate or lead frame (refer to FIG. 10) may be applied to the flip-chip bonding structure, in addition to the PCB. Since the light emitting apparatus 500 may be minimized in size, the light emitting apparatus 500 maybe utilized in various application fields. Furthermore, the light emitting apparatus 500 may be used as a lighting apparatus having a light distribution pattern of which color spots are reduced, in terms of white light emission. Meanwhile, as described above, the wavelength conversion portion 102 is formed on the diode upper surface of the light emission structure S, and the wavelength conversion portion 102 is not in contact with the conductive patterns 503a and 503b. Therefore, the reliability of the diode may increase, in particular, when the wavelength conversion portion 102 includes quantum dots.

The light emitting diode 200 of FIG. 4 includes a light emitting diode chip 210 and a wavelength conversion portion 202 formed on a light emitting surface of the light emitting diode chip 201. As in the above-described embodiment, the wavelength conversion portion 202 is formed to cover the upper surface of the light emitting diode 200. The diode upper surface has a structure in which a flat surface is formed in a region adjacent to the center thereof and a curved surface is formed in a region adjacent to the corner thereof. The light emitting diode chip 201 includes an n-type semiconductor layer 204, an active layer 205, and a p-type semiconductor layer 206, which form a light emission structure S. In addition to the light emission structure S, the light emitting diode chip 201 further includes a p-type contact layer 208 connected to the p-type semiconductor layer 206 and a p-electrode 203 connected to the p-type contact layer 208. In this case, the wavelength conversion portion 202 may be formed so as to cover the side surfaces of the light emission surface S and so as not to cover other portions, that is, the substrate 207 or the p-type contact layer 208. Such a structure may satisfy a condition in which the wavelength conversion portion 202 is limitedly formed only on the diode upper surface and has a flat surface and a curved surface, as illustrated in FIG. 4.

The substrate 207 is connected to the n-type semiconductor layer 204 through a plurality of conductive vias v, and may be electrically isolated from the active layer 205, the p-type semiconductor layer 206, and the p-type contact layer 208 by an insulator 209. In this embodiment, the n-type semiconductor layer 204 may receive an electrical signal through the substrate 207. For this operation, the substrate 207 is formed of a conductive material. In such a structure, an electrode is not formed on the upper surface of the n-type semiconductor layer 204, which is provided as the light emitting surface. Accordingly, light emission efficiency is improved. Furthermore, since the plurality of conductive vias v are contacted with the n-type semiconductor layer 204, a current distribution effect may also be improved. Meanwhile, although not illustrated, a conductive wire may be formed so as to be connected to the p-electrode 203. In FIG. 4, a level difference between the upper surface of the n-type semiconductor layer 204 and the exposed surface of the p-type contact layer 208 is exaggerated. In reality, the level difference may correspond to a very small value, compared with the thickness of the conductive substrate 207.

Figure 5:
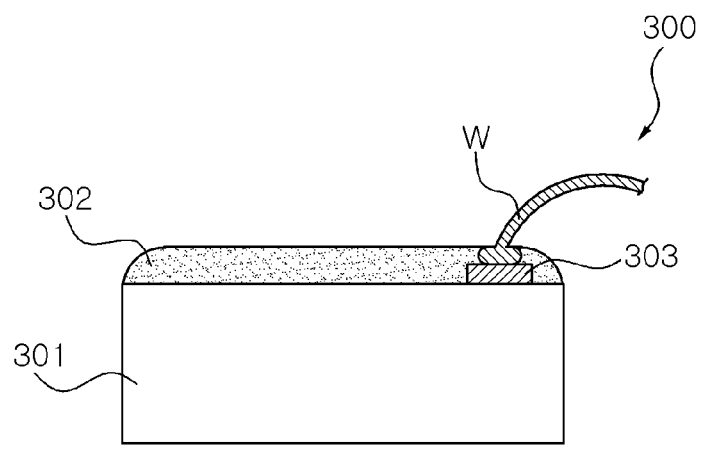
FIG. 5 is a schematic cross-sectional view of a light emitting diode according to another embodiment of the present invention.

FIG. 5 is a schematic cross-sectional view of a light emitting diode according to another embodiment of the present invention. Referring to FIG. 5, the light emitting diode 300 according to the embodiment of the present invention includes a light emitting diode chip 301 and a bonding pad 303 formed on one surface thereof. Furthermore, the light emitting diode 300 includes a wavelength conversion portion 302 formed on the surface on which the bonding pad 303 is formed. The bonding pad 303 is connected to a conductive wire W, and the wavelength conversion portion 302 is formed so as to cover at least the surface of the light emitting diode chip 301 and the bonding pad 303. That is, the wavelength conversion portion 302 is formed to cover the diode upper surface of the light emitting diode chip 301, similar to the above-described embodiment. In addition, the wavelength conversion portion 302 is formed so as to cover at least a part of a bonding portion of the conductive wire W connected to the bonding pad 303. The bonding portion of the conductive wire W is a region which is directly contacted with the bonding pad 303, and has a wider width than the other portion of the conductive wire W.

FIG. 5 illustrates that the wavelength conversion portion 302 covers the entire bonding portion of the conductive wire W. However, the wavelength conversion portion 302 may be contacted with the conductive wire W only at an extremely limited area, in a state in which the wavelength conversion portion 302 covers the bonding pad 303. Such a structure in which the wavelength conversion portion 302 covers the bonding pad 303 and is contacted with the conductive wire W may be implemented by applying a phosphor layer after the conductive wire W is formed. This will be described below in detail. In addition to such a difference, the shape or material of the wavelength conversion portion 302 may be the same as those of the above-described embodiment.

Figure 6:
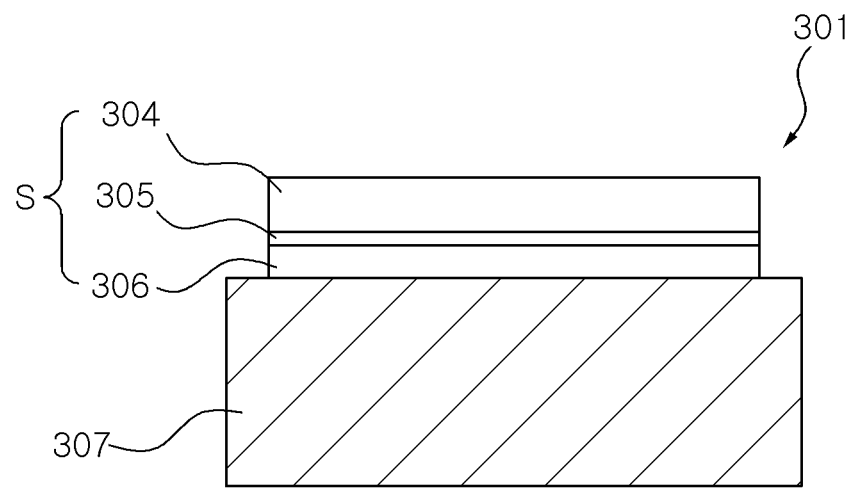
FIG. 6 is a schematic cross-sectional view illustrating an example of a light emitting diode chip which may be adopted in the light emitting diode of FIG. 5.
Figure 7:
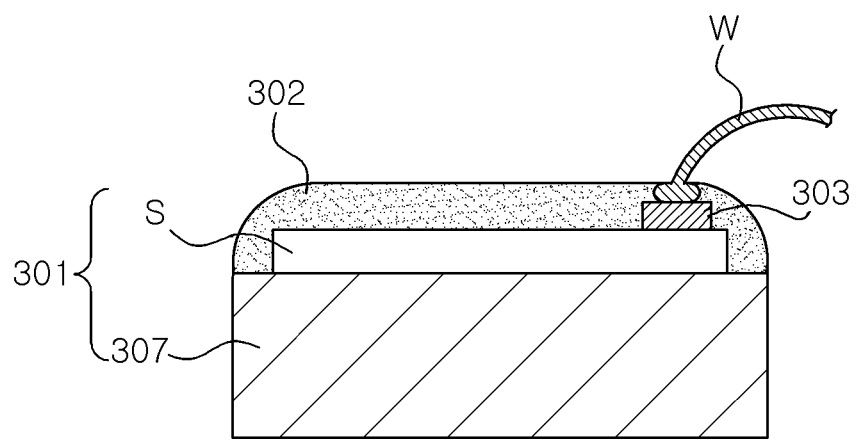
FIG. 7 illustrates a light emitting diode to which the light emitting diode chip of FIG. 6 is applied.

The light emitting diode chip having a structure in which the bonding pad is formed on one surface thereof and covered by the wavelength conversion portion may be applied in various forms. FIG. 6 is a schematic cross-sectional view illustrating an example of the light emitting diode chip which may be adopted in the light emitting diode of FIG. 5. FIG. 7 illustrates a light emitting diode to which the light emitting diode chip of FIG. 6 is applied. Referring to FIGS. 6 and 7, the light emitting diode chip 301 has a structure in which a light emission structure S is disposed on a conductive substrate 307, and the light emission structure S may include a p-type semiconductor layer 306, an active layer 305, and an n-type semiconductor layer 304 which are sequentially disposed. The conductive substrate 307 may serve to support the light emission structure S and function as a p-electrode. The conductive substrate 307 may be formed of a material including any one of Au, Ni, Al, Cu, W, Si, Se, and GaAs, for example, a material having Si doped with Al. In this embodiment, the diode upper surface maybe formed by the upper surface of the light emission structure S and a part of the upper surface of the substrate 307, that is, a region which is not occupied by the light emission structure S.

The wavelength conversion portion 302 is formed so as to cover the diode upper surface. As in the above-described embodiment, the upper surface of the wavelength conversion portion 302 has a structure in which a flat surface is formed in a region adjacent to the center thereof and a curved surface is formed in a region adjacent to the corner thereof. The light emission structure S may be formed so as to occupy only a part of the upper surface of the conductive substrate 307. Specifically, the light emission structure S may be formed in a region excluding at least apart of the edge region. This structure may be formed by an etching process for separating the light emission structure S into unit diodes. In this case, the wavelength conversion portion 302 may be formed so as to cover the side surfaces of the light emission structure S, from the aspect that light is emitted even from the side surfaces of the light emission structure S. Meanwhile, the light emitting diode chip 301 described in FIG. 7 has a vertical structure, and the wavelength conversion portion 302 may also be applied to a light emitting diode having a horizontal structure in a similar manner.

Figure 8:
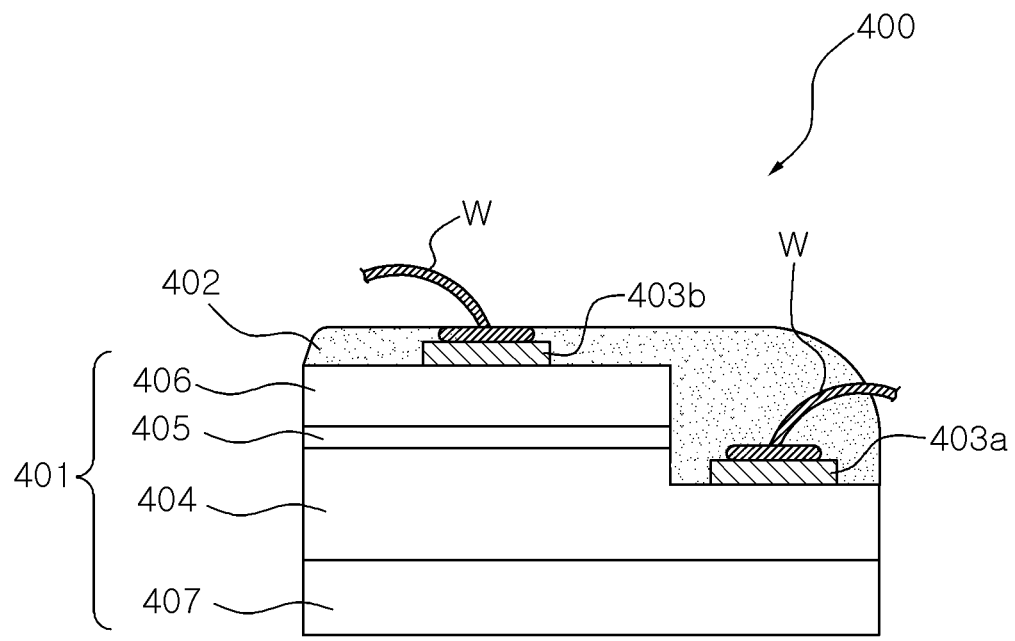
FIG. 8 is a schematic cross-sectional view of a light emitting diode according to another embodiment of the present invention.

FIG. 8 is a schematic cross-sectional view of a light emitting diode according to another embodiment of the present invention. Referring to FIG. 8, the light emitting diode 400 according to the embodiment includes a substrate 407, an n-type semiconductor layer 404, an active layer 405, and a p-type semiconductor layer 406. Furthermore, the light emitting diode 400 includes an n-electrode 403a formed on an exposed surface of the n-type semiconductor layer 404 and a p-electrode 403b formed on one surface of the p-type semiconductor layer 406. The light emitting diode chip 401 corresponds to a horizontal structure as described in FIG. 3. The light emitting diode 400 according to this embodiment is different from the light emitting diode according to the embodiment of FIG. 3 in that a wavelength conversion portion 402 is not formed on the substrate 407, but formed on the surfaces of the n-type and p-type semiconductor layers 404 and 406. Accordingly, the wavelength conversion portion 402 covers the n-electrode 403a and the p-electrode 403b corresponding to a bonding pad and is contacted with a part of a conductive wire W. The light emitting diode 400 is disposed on the substrate 407, and external power may be applied through the conductive wire W. In this embodiment, when viewed from above, the upper surface of the n-type semiconductor 404 and the upper surface of the p-type semiconductor layer 406 form the diode upper surface, and the wavelength conversion portion 402 may be formed on the diode upper surface. In FIG. 8, a level difference between the upper surface of the n-type semiconductor layer 404 and the upper surface of the p-type semiconductor layer 406 is relatively exaggerated. In reality, the level difference may correspond to a very small value, compared with the thickness of the substrate 407.

Similar to the above-described embodiment, the light emitting diode described with reference to FIGS. 7 and 8 may be mounted in various manners and used as a light emitting apparatus. As an example, a light emitting apparatus 500' illustrated in FIG. 10 may include lead frames 504a and 504b connected to external power terminals, respectively. The light emitting diode of FIG. 7 may be mounted on one lead frame 504a of the lead frames 504a and 504b, and the conductive substrate 307 may be physically and electrically connected to the lead frame 504b through a conductive adhesive layer 505. The conductive wire W, which is connected to the bonding pad 302 and has a part, for example, a bonding portion buried by the wavelength conversion portion 302, is connected to the other lead frame 504a. In this way, a plurality of light emitting diodes mounted on the lead frames 504a and 504b may be provided to form one light emitting apparatus. Different from this structure, the light emitting apparatus may be used as a single package structure. In this embodiment, since the light emitting apparatus 500' may also be minimized in size, the light emitting apparatus 500' may be utilized in various application fields and used as a lighting apparatus in which color spots of light distribution patterns are reduced in terms of white light emission. As described above, the wavelength conversion portion 302 is limitedly formed only on the upper surface of the light emitting diode chip 301 and is not in contact with the lead frames 504a and 504b. Therefore, the reliability of the diode may be improved, in particular, when the wavelength conversion portion 302 includes quantum dots.

Figure 11:
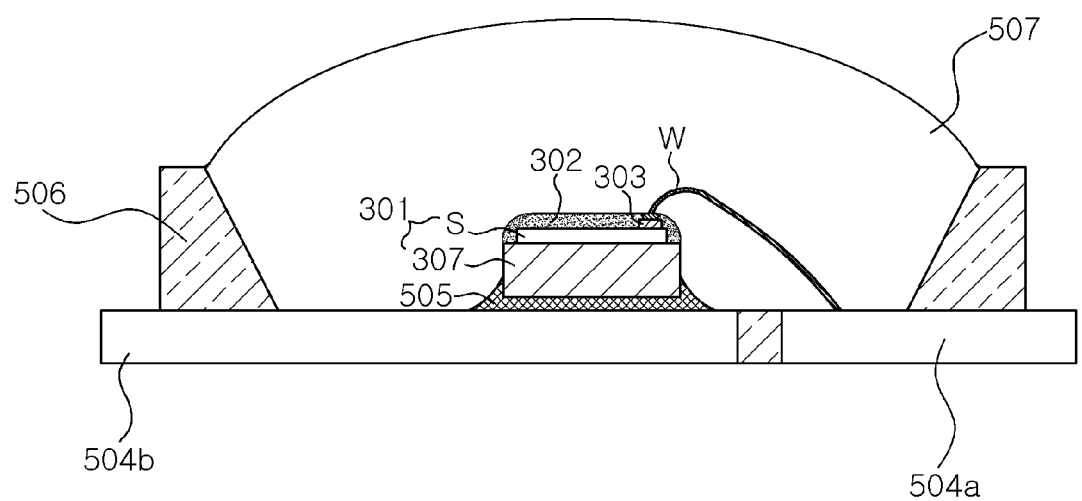
FIG. 11 is a schematic cross-sectional view of a light emitting diode package using the light emitting diode proposed in the embodiment of the present invention.

FIG. 11 is a schematic cross-sectional view of a light emitting diode package using the light emitting diode of FIG. 7. In a package structure, the lead frames 504a and 504b may be coupled by a package body 506, and a molding portion 507 may be formed so as to cover the light emitting diode and the conductive wire W. The package body 506 serves to physically fix the first and second lead frames 504a and 504b, and may adopt a reflecting cup structure to improve light emission efficiency. The molding portion 507 may be formed in a lens shape in which the reflecting cup of the package body 506 is filled with transparent resin to protect the light emitting diode and the conductive wire W. When the light emitting diode package is implemented by using the light emitting diode proposed in this embodiment, the light emitting diode may emit white light through the wavelength conversion portion 303 applied in the form of a phosphor layer, and phosphors do not need to be dispersed in the reflecting cup. Accordingly, the uniformity of color temperature may be guaranteed, and light which is absorbed or disappears unnecessarily may be minimized. Furthermore, since the etendue of the light source may be reduced, the light emitting apparatus may be used in various applications.

Figure 10:
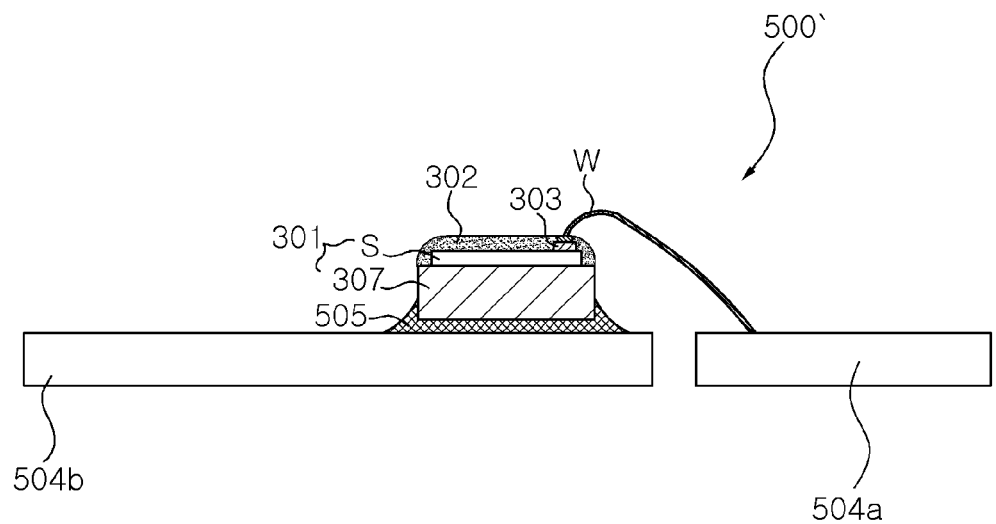

Meanwhile, the light emitting diode of FIG. 7 may be applied to a PCB (refer to FIG. 9) or a ceramic substrate as well as the above-described lead frame bonding structure of FIG. 10. Although not illustrated, the light emitting diode of FIG. 8 may also be mounted on a lead frame or a PCB in a similar manner.

Figure 12:
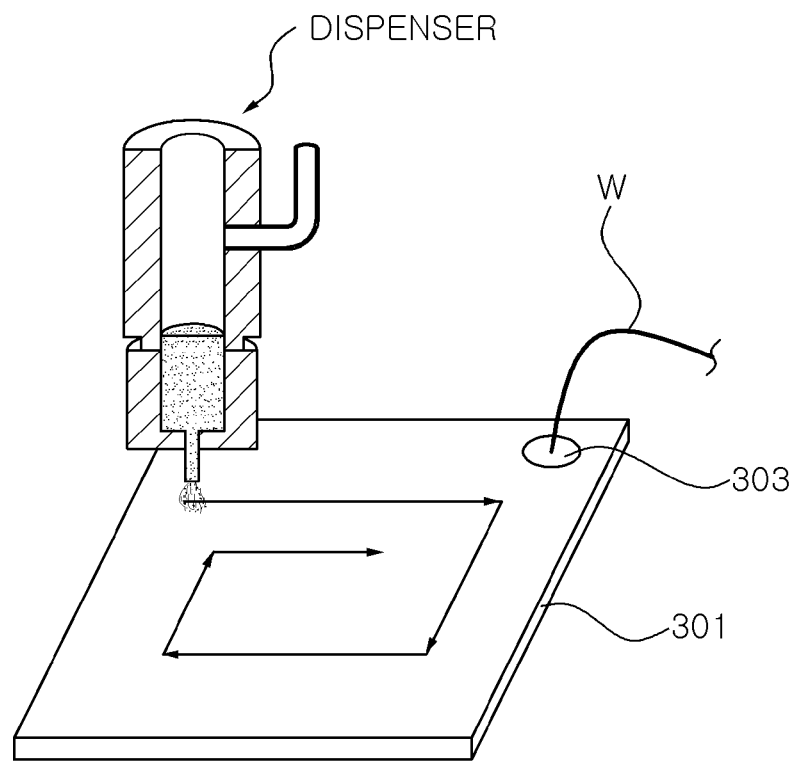
FIGS. 12 and 13 are perspective views explaining a method for forming a phosphor layer which may be adopted in the embodiments of the present invention.
Figure 13:
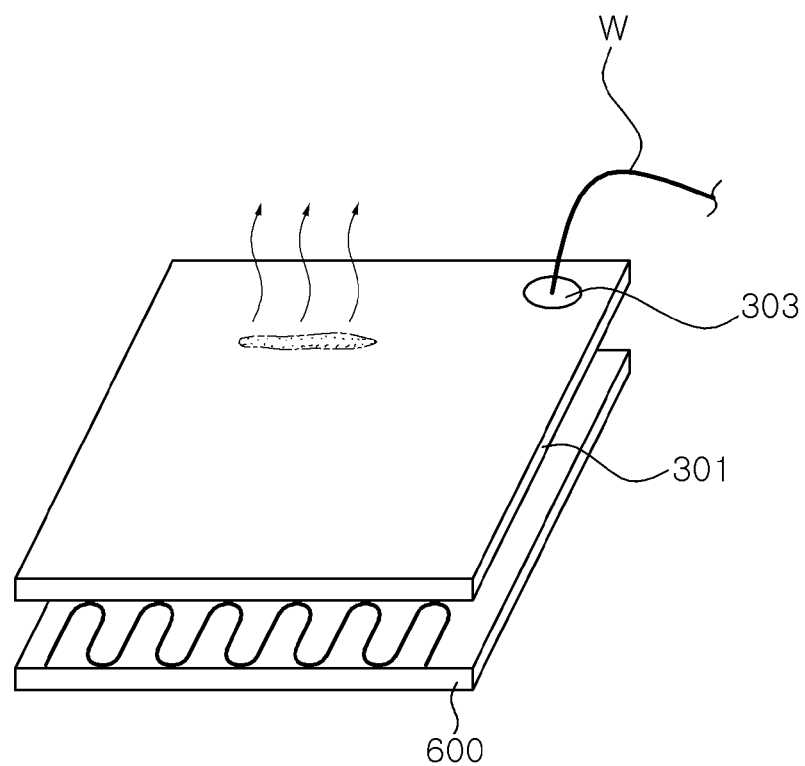

FIGS. 12 and 13 are perspective views explaining a method for forming a phosphor layer which may be adopted in the embodiments of the present invention. FIG. 12 illustrates a process in which a phosphor mixture is applied by using a dispenser, and FIG. 13 illustrates a state in which a solvent is evaporated after a predetermined amount of phosphor mixture is applied. FIGS. 12 and 13 show a process in which a phosphor layer is applied to the structure having the bonding pad 303 formed on one surface of the light emitting diode 310, that is, the light emitting surface. The light emitting surface corresponds to the diode upper surface in the above-described embodiment. However, the phosphor application process may be applied to the light emitting surface having no bonding pad as illustrated in FIGS. 2 and 4.

Referring to FIG. 12, the light emitting diode chip 301, a kind of a light emitting diode, is provided, and a phosphor mixture is applied to the light emitting surface of the light emitting diode chip 301. In this case, the light emitting diode chip 301 may have a structure as described with reference to FIG. 5. Before applying the phosphor mixture, the light emitting diode chip 301 may be separated into unit diodes. Then, the light emitting diode chip 301 may be die-bonded to a conductive structure such as a lead frame so as to be used as a light source of a light emitting apparatus. In the case of the phosphor layer formation process proposed in this embodiment, the bonding pad 303 is formed on the light emitting surface before the dispensing process, and the conductive wire W is formed to be connected to the bonding pad 303. In this case, the conductive wire W may be connected to a power terminal, for example, a lead frame. Next, the dispenser for applying the phosphor mixture is positioned over the light emitting diode chip 301, in a state in which the conductive wire W is connected to the light emitting diode 301.

The phosphor mixture may include a solvent as well as resin and phosphors. In a general phosphor layer formation method, a mixture of resin and phosphors is applied, and the resin is cured. When this method is used, the phosphor layer may be formed with a curved surface, due to surface tension of the resin before the resin is cured. Therefore, it is difficult to form a phosphor layer having a uniform thickness. In this embodiment, however, the amount of phosphors is increased more than the amount of resin, before the resin is cured. Therefore, the fluidity of the mixture applied to the light emitting diode chip 301 is reduced. Specifically, based on the weight ratio of phosphors and resin, a mixture in which the amount of phosphors is two or more times larger than that of resin may be used. Under such a mixing ratio, it is possible to guarantee a viscosity corresponding to a required level. Furthermore, as described above, the mixture may further include transparent fine particles formed of materials such as $SiO_2$, $TiO_2$, and $Al_2O_3$ for adjusting the color temperature. Based on the weight ratio of phosphors to transparent fine particles, the amount of phosphors may be two or more times larger than the amount of transparent fine particles.

However, when the viscosity increases with the increase in the amount of phosphors, there are difficulties in performing the dispensing process. Furthermore, as the mixture spreads over the light emitting surface, the phosphor layer may not be formed properly. In order to solve such a problem, a predetermined amount of solvent may be added to the phosphor mixture. The solvent may be mixed with the resin and the phosphors or the resin, the phosphors, and the transparent fine particles. The solvent may provide fluidity to the phosphor mixture such that the dispensing process is smoothly performed. The phosphor mixture having fluidity by the solvent may easily spread to the neighborhood from the position where the phosphor mixture is applied by the dispenser. Accordingly, the wavelength conversion portion having a desired thin-film structure may be easily formed. Since the solvent performs only a function of providing fluidity, a large amount is not necessary. Based on the weight ratio, a small amount of solvent corresponding to about 1/10 of the amount of phosphors may be mixed.

As described above, the phosphor mixture is applied onto the surface of the light emitting diode 301 by the dispenser. Referring to FIG. 12, the application process may be performed while the dispenser is moved in a spiral or zigzag manner, in order to uniformly apply the phosphor mixture to the surface of the light emitting diode chip 301. In this case, the dispensing process is performed in such a manner that the phosphor mixture covers the bonding pad 303 as well as the surface of the light emitting diode 301 from which light is emitted. During this process, a part of the conductive wire W may also be covered by the phosphor layer (the wavelength conversion portion). Meanwhile, in this embodiment, the dispensing means that the phosphor mixture, pressurized by a pump, is continuously applied through a needle. While the phosphor mixture is continuously applied, the state in which the phosphor mixture is connected to the chip upper surface from the dispenser is maintained in most cases. The dispensing process is different from a spray coating process in which phosphors are particulated and sprayed.

Referring to FIG. 13, a process in which the phosphor layer is formed after the dispensing process will be described. The solvent is evaporated from the phosphor mixture applied by the dispenser. Accordingly, the fluidity of the phosphor mixture decreases. With the decrease in the fluidity, the resin and the phosphors are fixed on the surface of the light emitting diode chip 301, thereby forming the wavelength conversion portion in a thin-film shape. During the dispensing process, a volatile material, for example, an organic solvent such as a polymer or a monomer having a relatively low molecular weight, alcohol, or acetone may be used as the solvent which is evaporated during the dispensing process.

Meanwhile, when the evaporation of the solvent is delayed in the dispensing process, the wavelength conversion portion may not be formed in a desired shape due to the excessive fluidity. Therefore, in order to promote the evaporation of the solvent, a heating unit 600 may be operated to apply heat to the phosphor mixture during the dispensing process. As the heating unit 600 is adopted, the fluidity of the phosphor mixture may be reduced immediately after the phosphor mixture is applied to the surface of the light emitting diode chip 301. Therefore, the deformation of the phosphor mixture may be further reduced, which makes it possible to form a flat phosphor layer. In this case, in order to satisfy a proper temperature condition under which the fluidity is reduced, the light emitting diode chip 301 may be heated to 50 to 170° C. However, when the method according to the embodiment is used, the region corresponding to the corner of the light emitting diode chip 301 is not formed with a flat surface. Therefore, in the region corresponding to the corner, the thickness of the phosphor layer gradually decreases, and a curved surface is formed. Accordingly, it is possible to obtain the light emitting diode having the above-described structure.

As such, when the phosphor layer formation method proposed in this embodiment is used, the content of the phosphors is increased, and the volatile solvent is used to compensate for the fluidity. Therefore, the phosphor layer is formed only on a specific desired surface in the light emitting diode chip. Furthermore, the deformation of the phosphor mixture during the dispensing process may be minimized, which makes it possible to obtain the phosphor layer having a desired thickness and shape. Furthermore, since the fluidity of the phosphor mixture is low, the deformation of the phosphor layer by surface tension may be minimized. Furthermore, from the aspect that the phosphor layer is separately applied after the light emitting diode chip is separated into unit diodes, the thickness of the phosphor layer or the content of phosphors may be properly adjusted in a state in which the property of the diode is previously understood. In the light emitting diode chip or the light emitting apparatus using the phosphor layer formed in such a manner, the thickness of the phosphor layer may be controlled with precision. Therefore, a color temperature difference between products decreases. Specifically, when a wafer-level phosphor layer formation method is used, that is, a phosphor layer is collectively formed before a light emitting diode chip is separated into unit diodes, the phosphor layer having the same thickness is applied in a state in which the light emission properties of the respective diodes are not reflected. Therefore, a color temperature difference may increase in comparison with the embodiment of the present invention.

Figure 14:
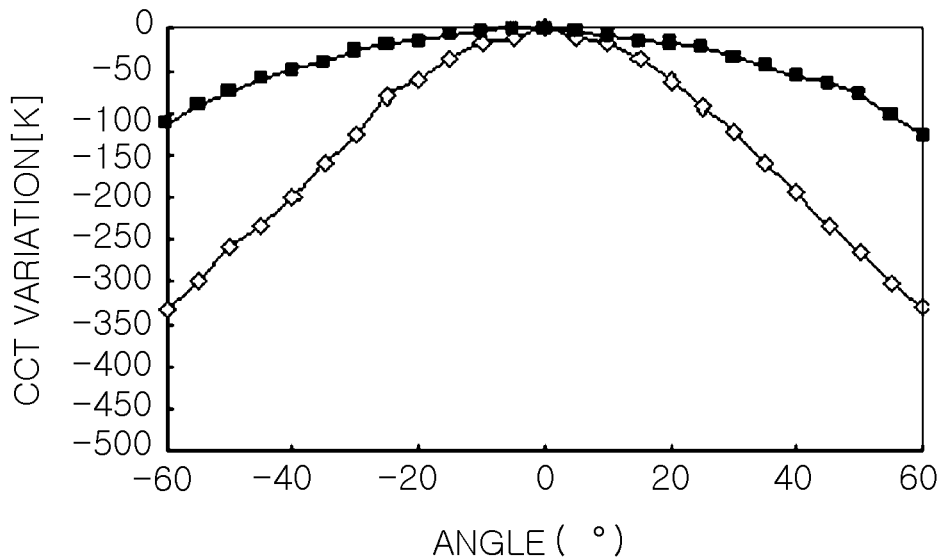
FIG. 14 is a graph comparatively showing light distribution patterns representing a color temperature property in the white light emitting apparatus according to the related art and the white light emitting apparatus according to the embodiment of the present invention.
Figure 15:
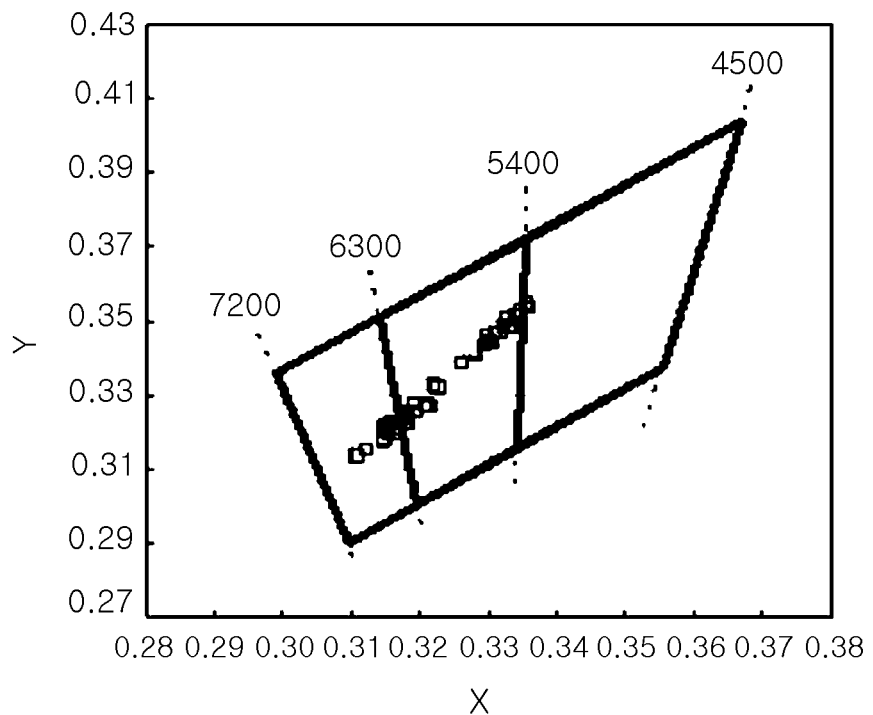
FIGS. 15 and 16 are graphs comparatively showing color distribution properties in the white light emitting apparatus according to the related art and the white light emitting apparatus according to the embodiment.

FIG. 14 is a graph comparatively showing light distribution patterns representing a color temperature property in the white light emitting apparatus according to the related art and the white light emitting apparatus according to the embodiment of the present invention. In FIG. 15, a line including block dots indicates the property of the light emitting apparatus according to the embodiment of the present invention, that is, the light emitting apparatus having the structure as illustrated in FIG. 10, and a line including white dots indicates the property of the light emitting apparatus according to the related art, in which phosphors are dispersed in the reflecting cup. Referring to FIG. 14, the light emitting apparatus according to the related art may include color spots in that the color temperature difference thereof ranges from 0 to 332K depending on angles of radiation. However, in the case of the light emitting apparatus according to the embodiment of the present invention, the maximum color temperature difference corresponds to 126K, which means that the color temperature difference is reduced to the half of the color temperature difference of the light emitting apparatus according to the related art. This is because, while light passing through the wavelength conversion portion according to the embodiment of the present invention has a uniform path length, the path length of light passing through phosphors in the structure illustrated in FIG. 1 may differ depending on direction.

Figure 16:
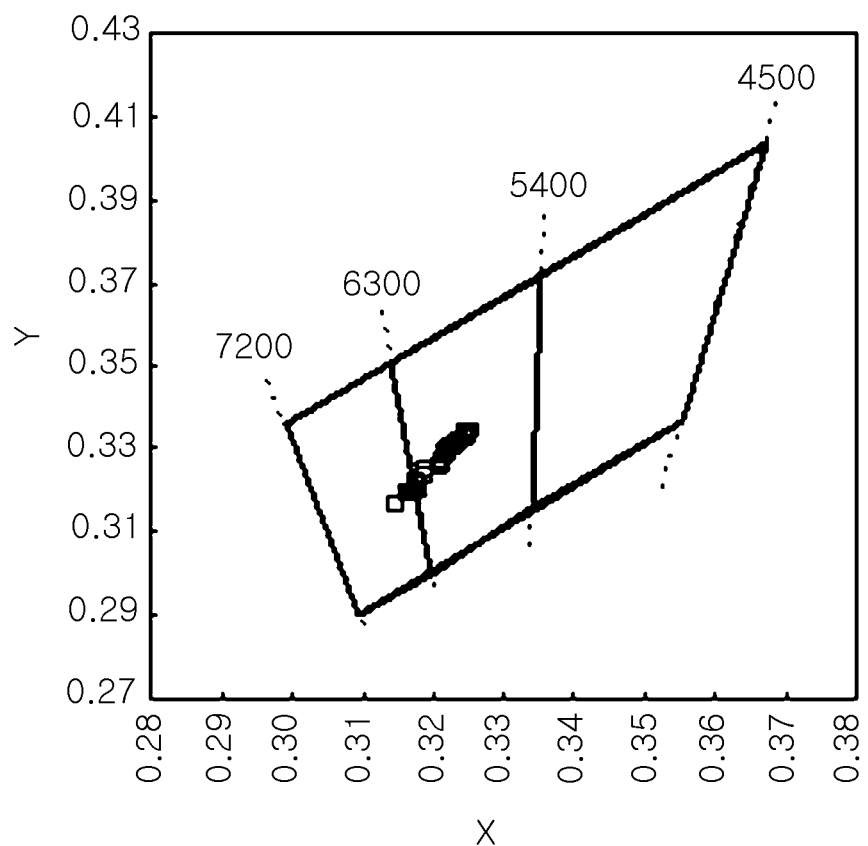

FIGS. 15 and 16 are graphs comparatively showing color distribution properties in the white light emitting apparatus according to the related art and the white light emitting apparatus according to the embodiment. FIGS. 15 and 16 show a result obtained by performing an experiment in a state in which lenses are attached to the white light emitting apparatuses as finalized products. As described above, the white light emitting apparatus according to the related art corresponds to the reflecting cut structure of FIG. 1. Referring to FIGS. 15 and 16, the color distribution properties may be compared. In FIG. 15, the maximum color temperature difference between products may approach 1,386K in the light emitting apparatus according to the related art. In FIG. 16, however, the maximum color temperature difference between products may approach 665K in the light emitting apparatus according to the embodiment of the present invention. Therefore, according to the embodiment of the present invention, the color distribution between products may be reduced to the half of that of the light emitting apparatus according to the related art.

According to the embodiments of the present invention, light emission efficiency may be improved, and the size of the light source may be minimized. Furthermore, color spots of light distribution patterns may be reduced in terms of white light emission, and a light emitting diode capable of the color temperature difference between products may be obtained. Furthermore, the method for fabricating a phosphor layer provides the phosphor layer application process for obtaining the light emitting diode. Furthermore, the embodiment of the present invention may provide a light emitting apparatus including the above-described light emitting diode.

While the present invention has been shown and described in connection with the exemplary embodiments, it will be apparent to those skilled in the art that modifications and variations can be made without departing from the spirit and scope of the invention as defined by the appended claims.

What is claimed is:

1. A light emitting diode comprising:
   a light emitting diode chip comprising a substrate and a light emission structure disposed on the substrate; and
   a wavelength conversion portion covering at least one surface of a diode upper surface and a diode lower surface, wherein a surface formed by the light emitting diode chip, when viewed from above the light emission structure, is defined as the diode upper surface and a surface formed by the light emitting diode chip, when viewed from below the substrate, is defined as the diode lower surface,
   wherein the wavelength conversion portion does not deviate from the diode upper surface or the diode lower surface and has a flat surface parallel to the diode upper surface or the diode lower surface and at least one curved surface connecting the flat surface to a corner of the diode upper surface or the diode lower surface, and
   wherein one end of the curved surface, which does not contact the flat surface, contacts an area of the light emitting diode on which the wavelength conversion portion is not disposed.

2. The light emitting diode of claim 1, wherein the light emitting diode chip further comprises a bonding pad disposed on a part of the diode upper surface.

3. The light emitting diode of claim 2, wherein the wavelength conversion portion covers the bonding pad.

4. The light emitting diode of claim 3, further comprising a conductive wire connected to the bonding pad.

5. The light emitting diode of claim 4, wherein the conductive wire comprises a bonding portion provided in a region which is contacted with the bonding pad, the bonding portion having a wider width than that of the other portion of the conductive wire.

6. The light emitting diode of claim 5, wherein the wavelength conversion portion covers at least a part of the bonding portion.

7. The light emitting diode of claim 1, wherein the light emission structure comprises n-type and p-type semiconductor layers and an active layer formed between the n-type and p-type semiconductor layers.

8. The light emitting diode of claim 7, wherein the substrate comprises a conductive substrate, and the p-type semiconductor layer, the active layer, and the n-type semiconductor layer are sequentially disposed on the substrate.

9. A light emitting diode comprising:
a light emitting diode chip comprising a substrate and a light emission structure disposed on the substrate; and
a wavelength conversion portion covering at least one surface of a diode upper surface and a diode lower surface, wherein a surface formed by the light emitting diode chip, when viewed from above the light emission structure, is defined as the diode upper surface and a surface formed by the light emitting diode chip, when viewed from below the substrate, is defined as the diode lower surface,
wherein the upper surface of the light emission structure comprises two or more surfaces which are disposed to have a level difference therebetween, and
wherein the wavelength conversion portion is disposed on the upper surface of the light emission structure having the two or more surfaces disposed to have the level difference therebetween such that the wavelength conversion portion covers the two or more surfaces having the level difference and has a flat surface across the surfaces having the level difference.

10. The light emitting diode of claim 1, wherein the wavelength conversion portion covers at least a part of side surfaces of the light emission structure and does not cover side surfaces of the substrate.

11. The light emitting diode of claim 1, wherein the wavelength conversion portion comprises transparent resin and phosphors.

12. The light emitting diode of claim 11, wherein the wavelength conversion portion contains the phosphors at a ratio in which the amount of the phosphors is two or more times larger than the amount of the transparent resin, based on a weight ratio of the phosphors to the transparent resin.

13. The light emitting diode of claim 11, wherein the wavelength conversion portion further comprises transparent fine particles.

14. The light emitting diode of claim 13, wherein the transparent fine particles comprise one or more materials selected from the group consisting of SiO2, TiO2, and Al2O3.

15. The light emitting diode of claim 13, wherein the wavelength conversion portion contains the transparent fine particles at a ratio in which the amount of the phosphors is two or more times larger than the amount of the transparent fine particles, based on a weight ratio of the phosphors to the transparent fine particles.

16. The light emitting diode of claim 1, wherein the wavelength conversion portion comprises quantum dots having cores sizes in the range from 2 to 100 nm.

17. The light emitting diode of claim 1, wherein the wavelength conversion portion comprises quantum dots each having a core, a shell, and an organic ligand formed on an outside of the shell.

18. The light emitting diode of claim 17, wherein the organic ligand is oleic acid.

19. The light emitting diode of claim 1, wherein the wavelength conversion portion does not contact a plating pattern of the light emitting diode.

20. The light emitting diode of claim 1, wherein the wavelength conversion portion does not contact a lead frame of the light emitting diode.

21. The light emitting diode of claim 1, wherein the wavelength conversion portion has a thickness of 25 to 150 μm.

22. A light emitting diode comprising:
a light emitting diode chip comprising:
a substrate;
a light emission structure disposed on the substrate and comprising first and second conductive-type semiconductor layers separated by an active layer; and
at least one conductive via formed through the first conductive-type semiconductor layer so as to electrically contact the second conductive-type semiconductor layer; and
a wavelength conversion portion covering at least one surface of a diode upper surface and a diode lower surface, wherein a surface formed by the light emitting diode chip, when viewed from above the light emission structure, is defined as the diode upper surface and a surface formed by the light emitting diode chip, when viewed from below the substrate, is defined as the diode lower surface,
wherein the wavelength conversion portion does not deviate from the diode upper surface or the diode lower surface and has a flat surface parallel to the diode upper surface or the diode lower surface and a curved surface connecting the flat surface to corners of the diode upper surface or the diode lower surface.

23. The light emitting diode of claim 22, further comprising an insulator disposed between the substrate and the first conductive-type semiconductor layer.

* * * * *